(12) United States Patent
Kotlow et al.

(10) Patent No.: US 6,795,783 B2
(45) Date of Patent: Sep. 21, 2004

(54) METHOD OF AND APPARATUS FOR ACCURATE RESISTANCE MEASUREMENT WITH A PROGRAMMABLE CURRENT SOURCE

(75) Inventors: Daniel B. Kotlow, Cherry Hill, NJ (US); Carlos A. Barberis, Haverhill, MA (US)

(73) Assignee: MicroLogic, Inc., Westborough, MA (US)

( * ) Notice: Subject to any disclaimer, the term of this patent is extended or adjusted under 35 U.S.C. 154(b) by 15 days.

(21) Appl. No.: 10/198,665

(22) Filed: Jul. 16, 2002

(65) Prior Publication Data

US 2004/0015306 A1 Jan. 22, 2004

(51) Int. Cl.$^7$ ................................................ G06F 9/02
(52) U.S. Cl. ........................ 702/65; 702/57; 702/60; 702/64; 702/189

(58) Field of Search ............................... 702/57, 60, 64, 702/65, 189, 33, 47, 53, 116, 133, 186; 324/758; 607/28; 73/29.1; 338/64

(56) References Cited

U.S. PATENT DOCUMENTS

| 5,869,970 A | * | 2/1999 | Palm et al. | ................... 324/433 |
| 5,914,611 A | * | 6/1999 | Cheng | .......................... 324/719 |
| 6,154,041 A | * | 11/2000 | Cheng | .......................... 324/758 |
| 6,498,471 B2 | * | 12/2002 | Barker | ...................... 324/76.53 |

* cited by examiner

*Primary Examiner*—Marc S. Hoff
*Assistant Examiner*—Felix Suarez
(74) *Attorney, Agent, or Firm*—Rines and Rines

(57) ABSTRACT

Remote resistance measurement technique using a programmable current source to enable accurate measurement of resistance, such as physical parameter sensing resistors such as for the remote monitoring of vehicular construction equipment or the like, particularly where full physical access to the sense resistor is not possible, as, for example, in vehicular fuel gauge applications and the like.

33 Claims, 2 Drawing Sheets

Figure 1:
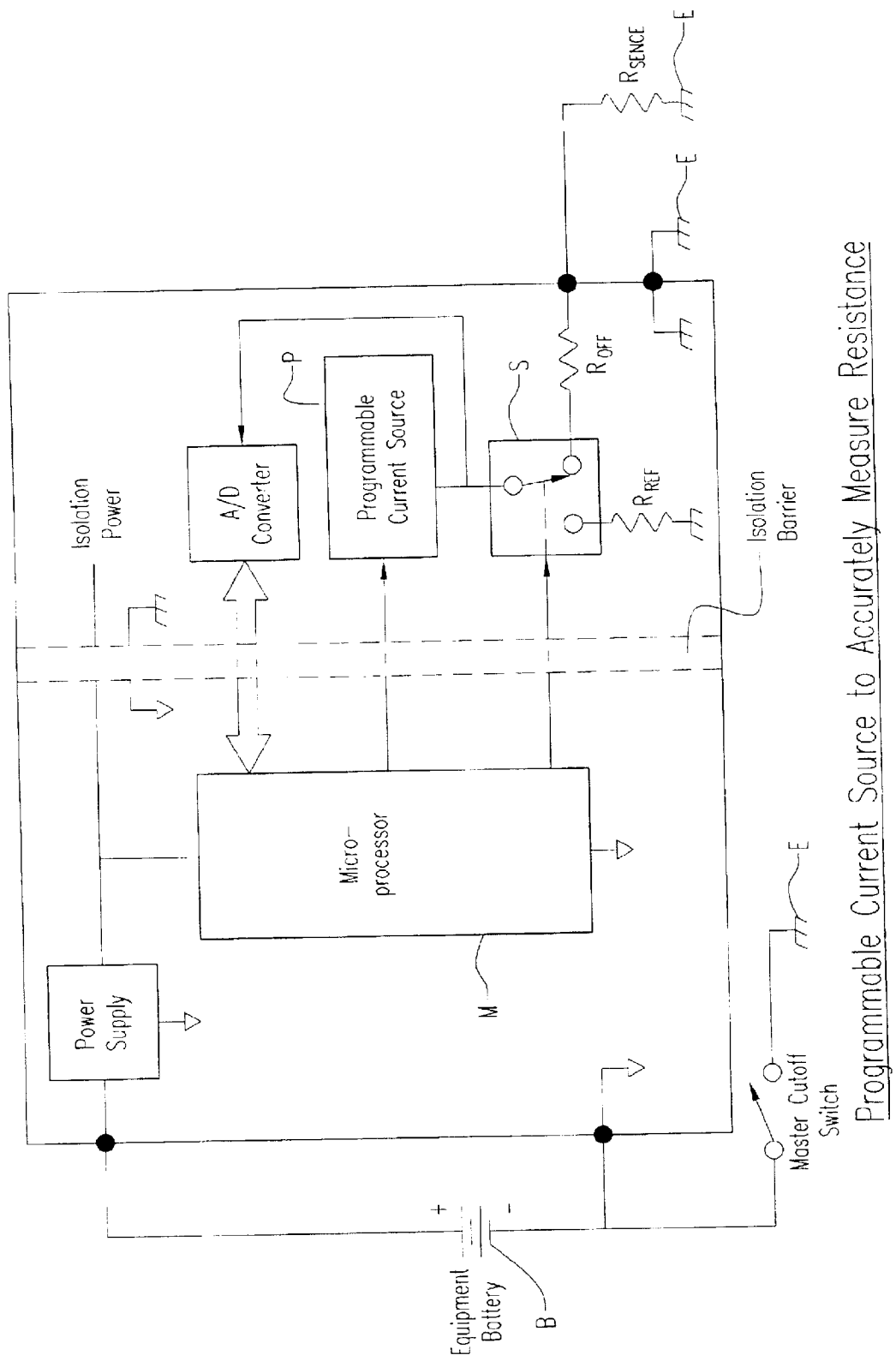

Programmable Current Source to Accurately Measure Resistance

Programmable Current Source to Accurately Measure Resistance

METHOD OF AND APPARATUS FOR ACCURATE RESISTANCE MEASUREMENT WITH A PROGRAMMABLE CURRENT SOURCE

FIELD

The invention relates to electrical and electronic circuits and techniques for making accurate measurements of resistance and on a continuing basis; being more particularly, though not exclusively, concerned with such measurement wherein sensed physical parameters are converted or transduced in a sensing resistance for measurement, as for remotely monitoring construction or other equipment (for example, for fuel gauge measurements) and where it is necessary to measure and sense resistance without having full physical access to the sense resistor (as of the fuel gauge or the like).

BACKGROUND

While, as more particularly explained hereinafter, the invention is of much more general utility, the above illustrative example of remotely monitoring construction or other equipment is an important application of the technique underlying the invention and will be hereinafter discussed as an exemplary, though not exclusive, use. In copending U.S. patent application Ser. No. 09/416,604, filed Oct. 12, 1999, and of common assignee herewith, such systems are described for remotely keeping track of the location and the operating conditions of fleets of vehicular construction equipment through each locally sensing such conditions or parameters as engine fuel level, engine run hours and the like, and supplying information as to such by radio communications links to a remote monitoring center or station, thereby enabling the fleet manager remotely to monitor and maintain the operation of the fleet and to improve efficiency of equipment utilization through such appropriately processed and displayed information.

In many data acquisition applications, a sensor transduces or converts a physical quantity being sensed into an electrical resistance, which can be measured by electronic means. This is done in many fuel level sensors used in heavy construction equipment and the like, wherein a resistance controls the amount of current passing between the equipment ground and the fuel gauge, causing a proportional amount of deflection of the fuel gauge needle.

Fuel sensors, for example, are basically variable resistors, and they cover a broad range of resistance depending upon the make and model. There is difficulty involved in measuring such a wide range and, in particular, making accurate measurements on those fuel sensors which have a very low resistance and operate in an environment with considerable electronic noise produced from the vehicular equipment engine.

In accordance with the present invention, these problems in accurate resistance measurements of variable sensing low-value resistors, are admirably solved through the use of a programmable current source operating with a known reference or standard resistor for calibration. Basically, two different currents are measured on the known reference resistor, and then two different currents on the sensing resistor, and then appropriate calculations are made, including appropriate subtraction and ratios hereinafter detailed, to enable eliminating all the above-described sources of error and over a wide range of sensing resistor values, including low resistances, and over wide temperature ranges —35° to 85° C., more or less—in the real world of construction equipment fleets, and always with highly accurate readings.

The conventional way to measure resistance R, of course, is to put a known current i through the resistance and measure the voltage V across it; the two being related simply by Ohm's Law, $V=iR$. When, however, the resistance belongs to a foreign or remote system being monitored, a number of practical limitations intervene, which it is the purpose of the present invention to address and to mitigate, as will now be explained.

One of these practical limitations often resides in the lack of the proper common ground reference. In an exemplary system for monitoring construction equipment remotely, as an illustration, it is necessary to measure such a sensed resistance without having full physical access to both terminals of the sense resistor. In this example, it is convenient to connect to the sensor at the gauge; but the ground terminal of the sense resistor is not accessible, lying deep within the vehicle near the fuel tank. The measuring system will connect to the equipment chassis to establish a ground reference, but that ground reference may well not be the same as that of the sensor—and there may indeed thus be current flowing between the two, causing a potential difference due to ground loops in the equipment. As a result, when a known current i is sent through the resistor R, the voltage to ground that is measured will not be $V=iR$, as expected from Ohm's Law, but rather $V=iR+Vo$, where Vo is an unknowable potential difference between the two ground reference points above mentioned.

A second limitation may reside in temperature-dependent voltage offsets in the measuring circuitry, arising from the practical limitations of components in such measuring circuitry; in particular, operational amplifiers used to convert the range of voltages being measured to a convenient part of the operating range of the measuring circuitry. These effects vary from component to component, and with temperature for a single component; therefore, they can only be taken into account by the expensive technique of making detailed measurements on each manufactured instance of the measuring circuitry.

Component value inaccuracies in measurement circuitry can also produce multiplicative errors. The gain of an operational amplifier, for example, may differ by a small percentage from its nominal value due to allowable errors in its own construction and the resistors used to set the gain. For similar reasons, the current actually generated may be in error by a small percentage. In such event, the measured voltage V, instead of the above, will have a value $V=\{1+e\}iR+Voff$, where i is now the intended current, e is an unknowable but small error, and Voff (hopefully small) is also unknowable, consisting of a sum of components of the original Vo which are subject to any of, none, some, or all of the multiplicative errors in the system.

Still another factor inhibiting accurate resistance measurements, particularly in the setting of the above exemplary application of the invention, is the effect of noise and interference. All circuitry is, of course, subject to interference and noise; some rides on the external signal being monitored, some is induced from currents in adjacent circuits, and some is generated by thermal processes within components of the circuit itself. Components such as the before-mentioned operational amplifiers, moreover, have input voltage offset specifications and do not respond linearly to voltages below the specification. Noise can be partially mitigated by processing many measurements taken over time (filtering): but not if it gets distorted because the total voltage is driven below the amplifier specification.

The measuring circuit, therefore, has a voltage floor, below which it cannot measure with any accuracy, which is herein termed "a noise floor", for simplicity. If the range of values of R to be measured includes values too low (relative to the current source), V might well be below the noise floor. It is then necessary to introduce an offset resistor $R_{OFF}$ in series with R, where $R_{OFF}$ is chosen such that the voltage across $R_{OFF}$+R due to current i will always exceed the noise floor. R+$R_{OFF}$ is then measured instead of R, and $R_{OFF}$ is subtracted later at the end. Any deviation of the component $R_{OFF}$ from its nominal value will, however, be attributed to R, so that when R is smaller than $R_{OFF}$, it will be subject to a percentage error much larger than the tolerance of $R_{OFF}$ (by a factor R/$R_{OFF}$). If, for example, $R_{OFF}$ is nominally 30 ohms and has a 1% tolerance, and R is 2 ohms, an 0.3 ohm overage in $R_{OFF}$ might occur and cause R to be calculated as 1.7 ohms, a 15% error.

An additional limitation involves the dynamic range of the voltage measuring circuits. Such voltage measuring circuits have maximum voltages that they can measure, limited in some way by their own system operating voltages. If the R being measured gets large enough, the limit may be exceeded. While it is easy to scale down voltages, voltages corresponding to low values of R may well go below the noise floor, with the deleterious error consequences above discussed. The possibility of an intolerable limitation on the range of R, thus also needs to be addressed.

While lack of a common ground between the sensor resistor and the equipment chassis was previously addressed, there may also be other common ground problems. It may be, as another illustration, that the sensor and the measuring system power source do not share a common ground. This is often the case, for example, when the construction equipment is outfitted with a master cut off switch that disconnects the equipment chassis ground from the negative battery terminal, from which the sensor system is powered. The portion of the circuitry in electrical contact with the sensor then needs to be electrically isolated from the rest, which may include the processing "brains" of the device. The present invention is designed to address every one of the above limitations on enabling accurate resistance measurements, particularly in remote equipment monitoring applications and the like, as will later be more fully explained.

OBJECTS OF INVENTION

It is a primary object of the invention, accordingly, to provide a new and improved method of and apparatus for accurate resistance measurements and with the aid of a novel programmable current source that remarkably enables obviation of all of the prior art measurement limitations earlier discussed.

A further object is to provide such a novel resistance measurement technique that is particularly, but not exclusively, useful where both terminals of the sensor resistor are not readily available to the measurement circuit, as in, for example, the remote monitoring of sensing resistors (as associated, as an illustration, with fuel gauge measurements) of vehicular construction equipment, or in similar applications.

Other and further objects will be explained hereinafter and are more particularly delineated in the appended claims.

SUMMARY

In summary, however, from one of its important aspects, the invention embraces a method of accurately measuring the varying resistance of a sensing resistor, that comprises, alternately applying pairs of different currents to each of a sensing resistor and a standard reference resistor to develop corresponding pairs of different voltages; subtracting the different voltages of the respective pairs of different voltages; subtracting the different currents of the respective pairs of currents applied to the respective resistors; and taking the ratio of the subtracted pairs of different voltages each divided by the corresponding subtracted differences in the currents of the respective pairs of currents.

Preferred and best mode embodiments and designs are hereinafter explained in detail.

DRAWINGS

Figure 2:
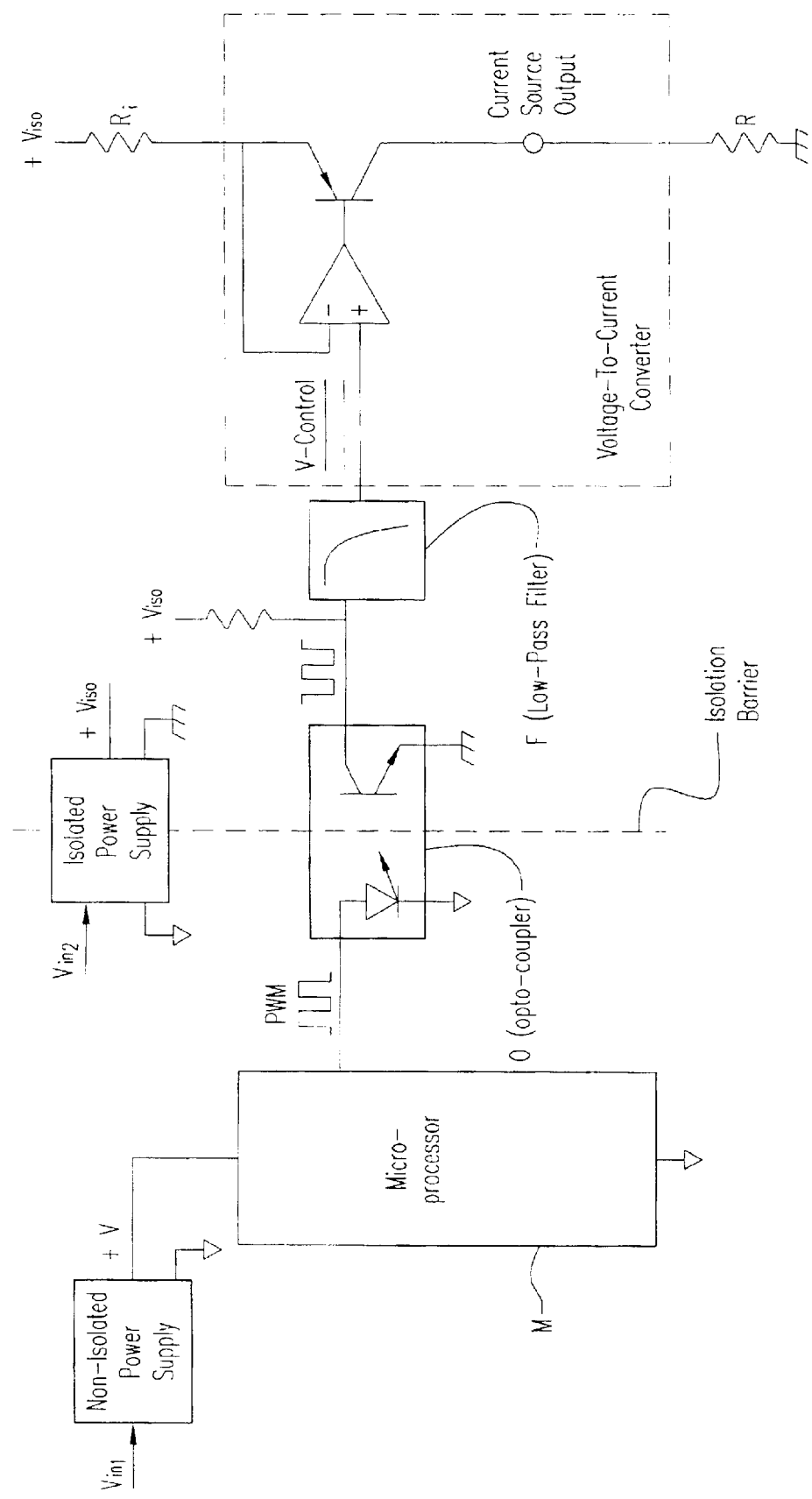

The invention will now be described in connection with the accompanying drawings, FIG. 1 of which is a combined block and circuit diagram of the invention, illustrating generically a programmable current source used in accordance with the technique of the invention accurately to measure resistance as in the remote monitoring of a sensor resistance, such as for remote vehicular fuel gauge level measurements or the like; and FIG. 2 is a similar diagram of a preferred modification using pulse width modulation and embodying an opto-coupler, low pass filter and voltage-to-current converter.

PREFERRED EMBODIMENT(S) OF THE INVENTION

FIG. 1 schematically illustrates the use, in accordance with the methodology of the invention, of a system for accurate measurement of resistance, such as the before-described exemplary fuel gauge sensing resistance R or other sensor of a vehicular equipment E having points of equipment chassis grounding, so-labeled, including for the negative terminal of an equipment battery B, upon the closing of the earlier-mentioned master cutoff switch. The circuit involves the previously referenced programmable current source P controlled by a microprocessor M and, in turn, feeding an A/D converter interacting with the microprocessor, as is well known. As briefly mentioned earlier, the current source feeds an offset resistor $R_{OFF}$ in series with the sensing resistor R under the control of a microprocessor-controlled switch S which enables comparison with a reference resistance $R_{REF}$, later explained. It was also before described that the position of the circuitry in electrical contact with the sensor is required to be electrically isolated from the rest of the system; and this is shown effected in FIG. 1 by the central "isolation barrier", with the vehicular equipment power supply which charges the battery B, as by a conventional alternator (not shown), and the microprocessor M—all isolated from the programmable current source P and its power source, the A/D converter, the relay switch S and the offset resistor $R_{OFF}$—the various sub-chassis "grounds" of which are also shown that normally give rise to the previously described deleterious ground loops.

The circuit sources different amounts of current to the sense resistor R, adapting the current to the size of R by processing the results obtained; using higher currents for lower values of R reduces the required size of $R_{OFF}$ and its attendant errors; using lower currents for higher values of R, on the other hand, mitigates the dynamic range problem also above described. The sense resistor is measured with a pair of two different currents $i_1$ and $i_2$, and the resulting pair of voltages $V_1$ and $V_2$ are subtracted:

$$V_1 - V_2 = (1+e)(i_1-i_2)(R+R_{OFF}) \tag{1}$$

The unknown offset errors due to the earlier described lack of common ground reference and temperature offsets, cancel out of this result. The currents are preferably chosen in a ratio greater than 1—say, substantially a 3:1 ratio, and adjusted each measurement toward a goal of having $V_1$ and $V_2$ approach substantially 25% and 75% of maximum, respectively. It is desirable to keep $V_1$ and $V_2$ apart, so the subtraction does not lose significance. If the larger, $V_1$, is below the noise floor, the measurements are discarded and the currents multiplied by the ratio of (max voltage: noise floor) for another try. This ratio is greater than 3:1, and so cannot result in $V_1$ getting too large. Likewise, if $V_2$ is too large, the measurements are discarded and the currents reduced by the same ratio for another try. If neither limit is exceeded, the results are accepted and used to calculate what the currents should be next time, assuming no change in R.

The before-mentioned two-position relay switch S connects the current source P to the sensor resistance R through $R_{OFF}$. In the example of sensing fuel level in remotely monitored construction equipment and the like, this is a requirement in any case because it is necessary to disconnect the sensor from the fuel gauge to do the measurement, and this intervention must be momentary. When the relay switch S is de-activated, the source current is alternately directed through the known reference resistor $R_{REF}$. Measurements at a pair of (two) currents, $i_3$ and $i_4$, are thus taken, and the respective results $V_3$ and $V_4$ are subtracted to eliminate offsets (which will be different for these measurements):

$$V_3 - V_4 = (1+e)(i_3 - i_4)R_{REF}. \quad (2)$$

Division now gives a ratio result free not only of all the unknowable offset errors but the unknown multiplicative errors before discussed:

$$(R + R_{OFF})/R_{REF} = [(V_1 - V_2)/(V_3 - V_4)][(i_3 - i_4)/(i_1 - i_2)]. \quad (3)$$

Each of the "measurements" described above is actually the result of taking many samples over time and post-processing them with a digital filter, which is implemented in the microprocessor in a preferred embodiment, as is well known, to eliminate the noise earlier described.

In the modification of FIG. 2, to exercise control of the currents across the isolation boundary, a pulse width modulated (PWM) signal is used to drive an opto-isolator O. The signal is generated by the system control processor M; and, in this approach, only one extra part is required to implement control over the current source. Another feature of this approach is that the ratios of different current selections are known with high accuracy, being proportional to the PWM duty cycle settings.

Referring to equation (3) described in connection with the operation of the embodiment of FIG. 1, for the system of FIG. 2, the second bracket on the right of equation (3) may be replaced by the ratio of the differences of the corresponding PWM duty cycles. When R is calculated from this, the error in the result depends only on:

(a) The component error in $R_{REF}$ (less than +−1%),
 (b) The component error in $R_{OFF}$ (most serious for small R, as discussed above),
 (c) The errors committed in the voltage measurement component (A/D converter).

With a 12-bit A/D converter, a few bits of error in (c), amount to 0.1% (although there are four measurement errors instead of one, as in a simplistic one-current, one-measurement approach).

In the modification of FIG. 2, moreover, using the Pulse Width Modulation (PWM), the opto-coupler O, a low-pass filter F and a voltage-to-current converter (so labeled), are used.

A non-isolated power supply with an input voltage $Vin_1$, powers the microprocessor M at +V, also controlling the PWM; and an isolated power supply with input from $Vin_2$ and output Viso sets the voltage levels of the low pass filter F and the operational amplifier A comprising the programmable current source $P^1$. $Vin_2$ could, if desired, be the same as $Vin_1$, or it could be +V, or it could be an independent power source. In a practical implementation, +V may be 5V. The isolated power supply may be a DC-to-DC converter/regulator, which produces 5V out with 5V in.

The PWM signal that is passed through the low-pass filter F produces a nearly DC level (Vcontrol) which is directly proportional to the pulse width. In the voltage-to-current converter, the op-amp A controls the current through the transistor T to produce a voltage drop across Ri such that the voltages at the two op-amp A inputs (1) and (2) are identical. Thus, the output current is determined by (+Viso−Vcontrol)/Ri.

Further modifications will also occur to those skilled in this art and such are considered to fall within the spirit and scope of the invention as defined in the appended claims.

What is claimed is:

1. A method of accurately measuring the varying resistance of a sensing resistor, that comprises, alternately applying from a programmable current source pairs of different currents to each of a sensing resistor and a standard reference resistor to develop corresponding pairs of different voltages; subtracting the different voltages of the respective pairs of different voltages; subtracting the different currents of the respective pairs of currents applied to the respective resistors; and taking the ratio of the subtracted pairs of different voltages each divided by the corresponding subtracted differences in the currents of the respective pairs of currents, wherein the currents applied to the sensing resistor are applied through an offset resistor and wherein the location of the sensing resistor is in equipment such as vehicular equipment that does not permit full physical access to both terminals of the sensing resistor, and wherein the sensing resistor comprises a parameter-measuring resistance, the ground terminal of which is in an equipment location not easily accessible.

2. The method of claim 1 wherein said ground terminal is not the same ground reference as the equipment chassis.

3. The method of claim 1 wherein the sensing resistor is a fuel gauge sensing resistance.

4. A method of accurately measuring the varying resistance of a sensing resistor, that comprises, alternately applying from a programmable current source pairs of different currents to each of a sensing resistor and a standard reference resistor to develop corresponding pairs of different voltages; subtraction the different voltages of the respective pairs of different voltages; subtraction the different currents of the respective pairs of currents applied to the respective resistors; and taking the ratio of the subtracted pairs of different voltages each divided by the corresponding subtracted differences in the currents of the respective pairs of currents, wherein the currents applied to the sensing resistor are applied thorough an offset resistor and wherein one pair of said different currents $i_1$ and $i_2$ enabling measurements of the sensing resistor (R) develops a pair of respective voltages $V_1$ and $V_2$ that, when subtracted, provides the result given by equation (I) herein, where ($R_{OFF}$) is said offset resistor.

5. The method of claim 4 wherein a plurality of samples of applying of the different currents is taken from the programmable current source over time and processed.

6. The method of claim 4 wherein the currents of the pair of different currents applied to the sensing resistors are chosen at a substantially 3:1 ratio.

7. The method of claim 4 wherein the location of the sensing resistor is in equipment such as vehicular equipment that does not permit full physical access to both terminals of the sensing resistor.

8. The method of claim 4 wherein the different current alternate applying step is effected with a microprocessor-controlled programmable current source and switching circuit feeding an A/D converter interacting with the microprocessor and enabling comparison of the sum of the sensing resistor (R) and said offset resistor ($R_{OFF}$) with said standard reference resistor ($R_{REF}$).

9. The method of claim 8 wherein an isolation barrier is established between any power supply for said equipment and said microprocessors, on the one hand, and the programmable current source, the A/D converter, said switching and said offset resistor ($R_{OFF}$).

10. The method of claim 4 wherein the values of the currents $i_1$ and $i_2$ are chosen in a ratio greater than 1.

11. The method of claim 10 wherein said ratio is chosen at substantially 3:1 and adjusted each measurement toward the goal of having $V_1$ and $V_2$ approach substantially 25% and 75% of maximum, respectively.

12. The method of claim 4 wherein another pair of said different currents $i_3$ and $i_4$ alternately applied to said standard reference resistor $R_{REF}$ develops a pair of respective voltages $V_3$ and $V_4$ that, when subtracted, provides the result given by equation (2) herein.

13. The method of claim 10 wherein said ratio is given by equation (3).

14. The method of claim 11 wherein each of the voltage measurements results from many samplings over time and post-processing, including digital filtering to eliminate noise.

15. Resistance measurement apparatus for accurately measuring the varying resistance of a sensing resistor having, in combination, a microprocessor controlled programmable current source; switching circuit for alternately applying pairs of different currents from the source to each of a sensing resistor and a standard reference resistor to develop corresponding pairs of different voltages; the processor enabling subtracting the different voltages of the respective pairs of different voltages and subtracting the different currents of the respective pairs of currents applied to the respective resistors; and the Processor further enabling taking the ratio of the subtracted pairs of different voltages each divided by the corresponding subtracted differences in the currents of the respective pairs of currents, wherein the location of the sensing resistor is in equipment such as vehicular equipment that does not permit full physical access to both terminals of the sensing resistors, and wherein the sensing resistor comprises a parameter-measuring resistance, the pound terminal of which is in an inaccessible location of the equipment.

16. The apparatus of claim 15 wherein the currents applied to the sensing resistor are applied in series through an offset resistor.

17. The apparatus of claim 16 wherein samples of the applying of the different currents from the programmable current source are processed over time.

18. The apparatus of claim 15 wherein the currents of the pair of different currents applied to the sensing resistor are adjusted at a substantially 3:1 ratio.

19. The apparatus of claim 15 wherein said ground terminal is not the same ground reference as the equipment chassis.

20. The apparatus of claim 15 wherein the sensing resistor is a fuel gauge sensing resistance.

21. The apparatus of claim 16 wherein the current source effects the different current applying with a microprocessor-controlled programmable current source and switching circuit feeding an A/D converter interacting with the microprocessor and enabling comparison of the sum of the sensing resistor R and said offset resistor $R_{OFF}$ with a reference resistor $R_{REF}$.

22. The apparatus of claim 15 wherein the different current alternating applying is effected with a microprocessor-controlled programmable current source and switching circuit feeding an A/D converter interacting with the microprocessor and enabling comparison of the sum of the sensing resistor R and said offset resistor $R_{OFF}$ with a reference resistance $R_{RE}$.

23. The apparatus of claim 21 wherein an isolation barrier is established between any power supply for said equipment and said microprocessor, on the one hand, and the programmable current source, the A/D converter, said switching and said offset resistor $R_{OFF}$.

24. The apparatus of claim 16 wherein one pair of said different currents $i_1$ and $i_2$ enables measurements of the sensing resistor R to develop a pair of respective voltages $V_1$ and $V_2$ that, when subtracted, provide the result given by equation (I) herein, where $R_{OFF}$ is said offset resistor.

25. The apparatus of claim 24 wherein the programmable current source adjusts the values of the currents $i_1$ and $i_2$ in a ratio greater than 1.

26. The apparatus of claim 25 wherein said ratio is chosen at substantially 3:1 and adjusted each measurement toward the goal of having $V_1$ and $V_2$ approach substantially 25% and 75% of maximum, respectively.

27. The apparatus of claim 24 wherein the programmable current source applies another pair of said different currents $i_3$ and $i_4$ alternately to said standard reference resistor $R_{REF}$ to develop a pair of respective voltages $V_3$ and $V_4$ that, when subtracted, provides the result given by equation (2) herein.

28. The apparatus of claim 27 wherein said ratio is given by equation (3) herein.

29. The apparatus of claim 28 wherein each of the voltage measurements results from many samplings over time and post-processing, including digital filtering to eliminate noise.

30. The apparatus of claim 28 wherein the sensing resistor is to be measured remotely from the equipment.

31. The apparatus of claim 15 wherein a pulse width signal modulator is used to drive an opto-isolator to implement control over the current source.

32. The apparatus of claim 31 wherein the ratios of different current selections are proportional to the pulse width modulation duty cycle settings.

33. The apparatus of claim 32 wherein the ratio of equation (3) herein is produced but with the second bracket on the right of equation (3) replaced by the ratio of the differences of the corresponding pulse width modulation duly cycles.

* * * * *